(12) United States Patent
Jeong (10) Patent No.: US 9,236,439 B2
(45) Date of Patent: Jan. 12, 2016

(54) SEMICONDUCTOR DEVICE AND METHOD FOR FORMING THE SAME

(71) Applicant: SK HYNIX INC., Icheon (KR)

(72) Inventor: Young Doo Jeong, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/310,839

(22) Filed: Jun. 20, 2014

(65) Prior Publication Data

US 2015/0187899 A1    Jul. 2, 2015

(30) Foreign Application Priority Data

Jan. 2, 2014   (KR) ........................ 10-2014-0000133

(51) Int. Cl.
| | |
|---|---|
| *H01L 29/423* | (2006.01) |
| *H01L 29/49* | (2006.01) |
| *H01L 29/778* | (2006.01) |
| *H01L 29/66* | (2006.01) |
| *H01L 29/45* | (2006.01) |

(52) U.S. Cl.
CPC ...... *H01L 29/42376* (2013.01); *H01L 29/4236* (2013.01); *H01L 29/42356* (2013.01); *H01L 29/42372* (2013.01); *H01L 29/45* (2013.01); *H01L 29/4933* (2013.01); *H01L 29/4975* (2013.01); *H01L 29/66666* (2013.01); *H01L 29/7788* (2013.01)

(58) Field of Classification Search
CPC ..................... H01L 29/42356; H01L 29/4236; H01L 29/42364; H01L 29/42368; H01L 29/42372; H01L 29/42376; H01L 29/45; H01L 29/4933
See application file for complete search history.

(56) References Cited

U.S. PATENT DOCUMENTS

| | | | |
|---|---|---|---|
| 2008/0048333 A1* | 2/2008 | Seo et al. ........... | 257/773 |
| 2010/0013552 A1* | 1/2010 | Darwish et al. ..... | 327/581 |
| 2010/0240184 A1 | 9/2010 | Jung et al. | |
| 2010/0289059 A1* | 11/2010 | Hsieh ................. | 257/140 |
| 2012/0119285 A1* | 5/2012 | Yang .................. | 257/329 |
| 2012/0164812 A1* | 6/2012 | Ryu et al. ........... | 438/381 |
| 2013/0043519 A1* | 2/2013 | Moon et al. ......... | 257/296 |
| 2014/0061781 A1* | 3/2014 | Kim .................. | 257/331 |
| 2014/0063934 A1* | 3/2014 | Oh et al. ............. | 365/182 |
| 2014/0191298 A1* | 7/2014 | Chen et al. .......... | 257/288 |

FOREIGN PATENT DOCUMENTS

| | | |
|---|---|---|
| KR | 10-2007-0002664 A | 1/2007 |
| KR | 10-2010-0106112 A | 10/2010 |
| KR | 10-2014-0028980 A | 3/2014 |

OTHER PUBLICATIONS

T.J. Hwang et al., "Work Function Measurement of Tungsten Polycide Gate Structures", Journal of Electronic Materials, Feb. 28, 1983, pp. 667-679, vol. 12, No. 4.

C.M. Lin et al., "The Influence of Si Content on the Work Function of $W_{1-x}Si_x$ ($x \leq 14$ atom %) Gate Electrodes" Electrochemical and Solid-State Letters, Feb. 12, 2008, pp. H99-H102, vol. 11, No. 4, The Electrochemical Society.

* cited by examiner

*Primary Examiner* — Eduardo A Rodela (57) ABSTRACT

A semiconductor device includes a junction region on both sides of a trench in a semiconductor substrate, a first gate electrode with a first workfunction buried in the trench, and a second gate electrode formed of a polycide layer having a second workfunction overlapping with the junction region at an upper part of the first gate electrode.

8 Claims, 10 Drawing Sheets

SEMICONDUCTOR DEVICE AND METHOD FOR FORMING THE SAME

CROSS-REFERENCE TO RELATED APPLICATION

The priority of Korean patent application No. 10-2014-0000133 filed on 2 Jan. 2014, the disclosure of which is hereby incorporated in its entirety by reference, is claimed.

BACKGROUND OF THE INVENTION

In recent times, although demand for high-capacity dynamic random access memory (DRAM) is rapidly increasing, there is difficulty in increasing chip size, resulting in a limitation in increasing storage capacity of DRAM. The larger the chip size, the less the number of chips on each wafer, resulting in a reduction of productivity. Therefore, in recent times, intensive research is being conducted into a variety of methods for reducing a cell region by varying a cell layout so as to form a large number of memory cells on one wafer.

A buried gate structure has been developed as an example of the above-mentioned methods. The buried gate structure has some disadvantages. First, a leakage current caused by Gate Induced Drain Leakage (GIDL) characteristics increases between a conductive material (e.g., a gate electrode) and an N-type junction of an active region or between the conductive material and a storage node contact. Second, refresh characteristics (tREF, Refresh Time) of the whole semiconductor device deteriorate due to deterioration of GIDL characteristics.

To prevent a leakage current caused by GIDL characteristics from being increased, a conductive material (e.g., a gate electrode) of a buried gate is greatly etched so that an overlap region between a storage node contact and the conductive material can be minimized.

Assuming that a conductive material (gate electrode) of the buried gate is sufficiently etched, a leakage current caused by GIDL characteristics can be prevented from increasing. However, since buried gate resistance increases, the speed of a semiconductor device is increased, and current driving capability is deteriorated, resulting in the occurrence of Write-Recovery Time (twr) deterioration.

BRIEF SUMMARY OF THE INVENTION

Various embodiments of the present invention are directed to providing a semiconductor device and a method for forming the same that substantially obviates one or more problems due to limitations and disadvantages of the related art.

An embodiment of the present invention relates to a semiconductor device and a method for forming the same, which can improve GIDL characteristics of a buried gate, reduce contact resistance between double gates, and thus prevent device characteristics and reliability from being deteriorated.

In accordance with an aspect of the present invention, a semiconductor device includes: a trench in a semiconductor substrate; a junction region disposed on both sides of the trench; a first gate electrode buried in the trench, the first gate electrode having a first workfunction; and a second gate electrode disposed over the first gate electrode, the second gate electrode including a polycide material and having a second workfunction, wherein the second gate electrode and an upper portion of the first gate electrode overlap with the junction region.

In accordance with another aspect of the present invention, a semiconductor device includes: a junction region formed on both sides of a trench in a semiconductor substrate; a first gate electrode with a first workfunction buried in the trench, the first gate electrode having a top surface that does not overlap with the junction region; and a second gate electrode disposed over the first electrode, the second gate electrode including a polycide layer having a second workfunction and overlapping the junction region.

In accordance with another aspect of the present invention, a method for forming a semiconductor device includes: forming a trench by etching a gate region of a semiconductor substrate; forming a first gate electrode having a first workfunction in the trench; forming spaces between an upper portion of the first gate electrode and sidewalls of the trench; and forming a second gate electrode over the first gate electrode in such a manner that the second gate electrode overlaps with a junction region of the semiconductor substrate and is formed of a polycide material having a second workfunction.

Forming the spaces includes: forming a barrier metal layer over sidewalls of the trench; and etching a portion of the barrier metal layer disposed between sidewalls of the upper portion of the first gate electrode and sidewalls of the trench.

Forming the second gate electrode includes: depositing a polysilicon layer over a top surface of the first gate electrode and in the spaces between the upper portion of the first gate electrode and sidewalls of the trench; implanting impurities in the polysilicon layer; and performing a silicidation process on the polysilicon layer. The silicidation process includes forming a silicide in the first gate electrode.

The method further comprises before forming the first gate electrode, forming a gate insulation film over sidewalls of the trench. The method further comprises forming a barrier metal film over the first gate electrode. Forming the spaces between the upper portion of the first gate electrode and sidewalls of the trench includes etching upper portions of the barrier metal film, wherein side portions of the second gate electrode are formed in the spaces. The second workfunction is substantially the same as a workfunction of polysilicon. The impurity is an N-type.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers are used throughout the drawings to refer to the same or like portions. In the following description of the present invention, a detailed description of related known configurations or functions incorporated herein may be omitted for clarity of the subject matter of the present invention.

A semiconductor device according to an embodiment includes a first gate electrode formed of tungsten (W) and a second gate electrode formed of polycide, and improves GIDL characteristics by minimizing connection between a junction region and a metal gate electrode. In addition, embodiments provide a technology for preventing deterioration of device characteristics and reliability by reducing contact resistance between gate electrodes. The above technical principles can be applied to many kinds of semiconductor devices including semiconductor elements.

Semiconductor devices and the methods for forming the same according to embodiments will hereinafter be described with reference to FIGS. 1 to 5C.

Figure 1:
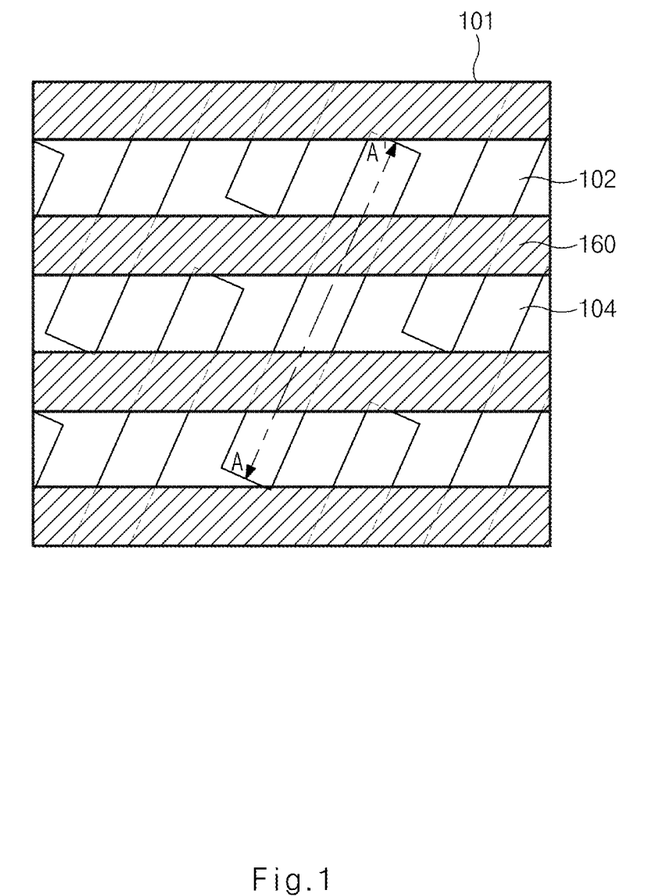
FIG. 1 is a plan view illustrating a 6F$^2$ structure of a semiconductor device according to an embodiment.

FIG. 1 is a plan view illustrating a $6F^2$ structure according to an embodiment.

Referring to FIG. 1, a device isolation film 104 defining an active region 102 is formed over a predetermined region of a semiconductor substrate 101, and a buried gate 160 is formed across the active region 102 not only in the active region 102 but also in the device isolation film 104. In this embodiment, the active region 102 obliquely crosses the buried gate 160 instead of being perpendicular to the buried gate 160.

Figure 2:
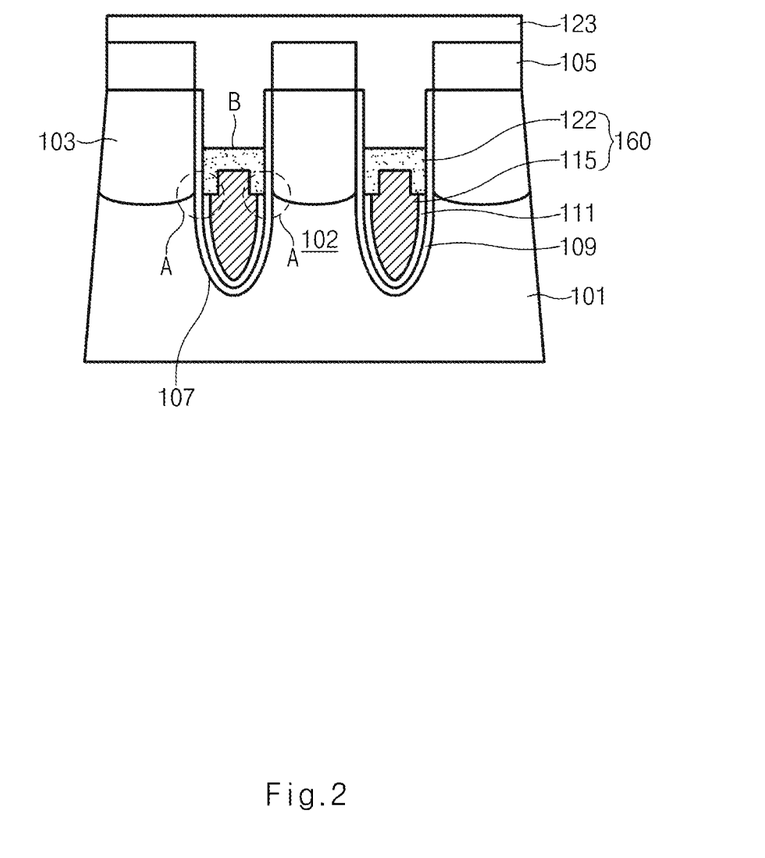
FIG. 2 is a cross-sectional view illustrating a semiconductor device taken along the line A-A' of FIG. 1 according to a first embodiment.

FIG. 2 is a cross-sectional view illustrating a semiconductor device taken along the line A-A' of FIG. 1 according to a first embodiment.

Referring to FIG. 2, a trench 107 is formed in the active region 102, and a gate insulation film 109 and a barrier metal film 111 are sequentially stacked in the trench 107, such that a semiconductor device according to an embodiment can be formed. A first gate electrode 115 is formed over the barrier metal film 111, and a second gate electrode 122 is formed over the first gate electrode 115.

The embodiment of FIG. 2 shows a buried gate 160 having two-part gate electrode structure that includes second electrode 122 disposed over a first gate electrode 115. Side portions of the second gate electrode 122 are disposed between a junction region 103 of the semiconductor substrate 101 and the first gate electrode 115. As indicated in area "A" of FIG. 2, lower surfaces of second gate electrode 115 are level with lower boundaries of junction region 103. The top surface of first gate electrode 115 and the top surface of second gate electrode 122 are both disposed above the lower boundary of junction region 103. That is, a top surface A of both sides of the first gate electrode 115 contiguous to the junction region 103 has a lower height than a top surface B of the center part between both sides.

In an embodiment, the second gate electrode 122 has an upper portion disposed over the upper surface of first electrode 115 and two side portions, each of which is disposed between a sidewall of the first gate electrode 115 and a sidewall of trench 107. In other words, a lower surface of the second gate electrode 122 has a symmetrical step-difference structure (⌐ ⌐). The structure of the second gate electrode 122 may be described as an inverted "U" shape, or a "⊓" shape. A upper surface of the first gate electrode 115 has a symmetrical step-difference structure. The second gate electrode 122 is formed to surround a upper portion of the first gate electrode 115.

In the embodiment of FIG. 2, gate insulation film 109 is interposed between sidewalls of the trench 107 and sidewalls of the second gate electrode 122.

As seen in the embodiment of FIG. 2, upper surfaces of first electrode 115 and second electrode 122 both vertically overlap with junction region 103. While only an upper portion of gate electrode 115 overlaps with junction region 103, the lower boundary of junction region 103 is aligned with bottom surfaces of the lower boundary so that all of second gate electrode vertically overlaps with the junction region 103.

In an embodiment, the first gate electrode 115 may be formed of a metal material such as titanium (Ti), titanium nitride (TiN), tungsten (W), tungsten nitride (WN), etc. The second gate electrode 122 may be formed of polycide achieved by silicidation of polysilicon doped with $N^+$ ions. The gate insulation film 109 may be formed of a $SiO_2$ film or may also be formed of a high-K material having a higher dielectric constant (higher permittivity) than the $SiO_2$ film.

As described above, according to a first embodiment, a second gate electrode 122 which is formed of a polycide material is disposed over the first gate electrode 115 which is formed of a metal material. Side portions of second gate electrode 122 are over sidewalls of an upper part of the first gate electrode 115 that overlaps with the junction region 103. Such a configuration reduces GIDL. In addition, the second gate electrode 122 may be formed of polycide having substantially the same workfunction as polysilicon. In an embodiment, when polycide is used for the second gate electrode 122 against a metal first electrode 115, a contact margin between the second gate electrode 122 and the first gate electrode 115 increases.

Figure 3:
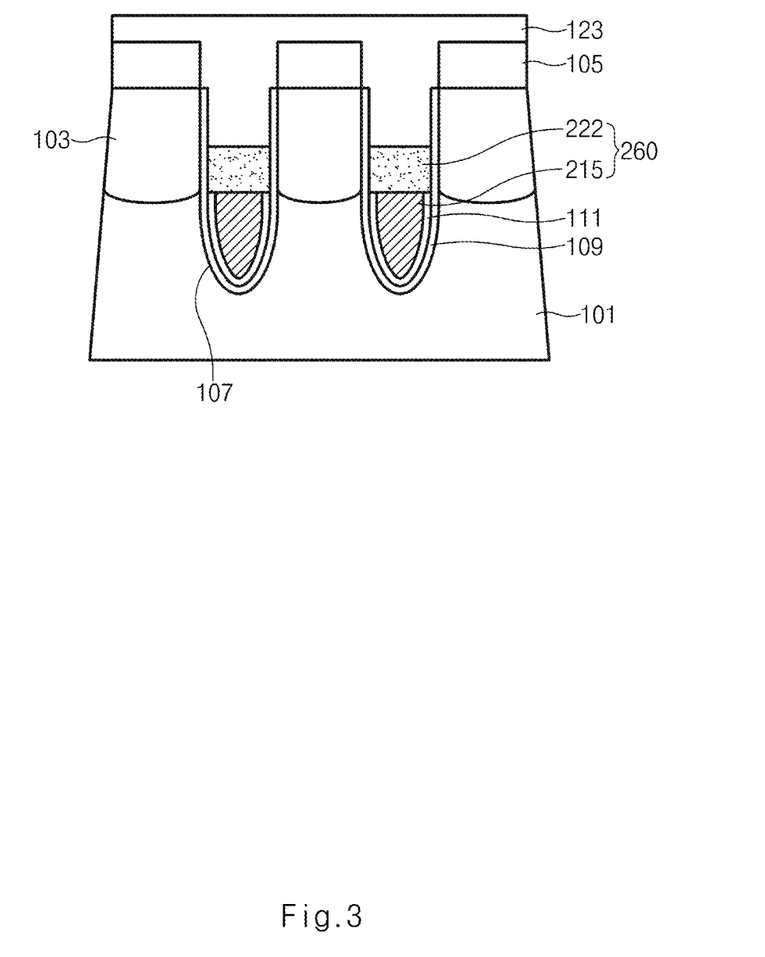
FIG. 3 is a cross-sectional view illustrating a semiconductor device taken along the line A-A' of FIG. 1 according to a second embodiment.

FIG. 3 is a cross-sectional view illustrating a semiconductor device according to a second embodiment.

Referring to FIG. 3, a semiconductor device according to a second embodiment includes a buried gate 260 buried in the semiconductor substrate 101. The buried gate 260 includes a gate insulation film 109 and a barrier metal film 111 sequentially formed in a trench, a first gate electrode 215 formed over the barrier metal film 111, and a second gate electrode 222 formed over the first gate electrode 215.

Referring to FIG. 3, the top surface of the first gate electrode 215 extends between side surfaces of barrier metal film 111, and a second gate electrode 222 formed of a polycide layer extends between side surfaces of gate insulation film 109 and is disposed over first gate electrode 215. Unlike the first gate electrode 115 of the first embodiment, the second gate electrode 215 of the second embodiment does not have lower side portions interposed between first gate electrode 115 and sidewalls of trench 107. Rather, in the embodiment of FIG. 3, second gate electrode 222 has a rectangular profile, and is entirely disposed above first gate electrode 215.

Similar to the first embodiment, the second gate electrode 222 is formed of a polycide material achieved by silicidation of polysilicon doped with $N^+$ ions, and has the same workfunction as that of polysilicon, resulting in improved contact resistance between double gate electrodes compared to a device with a polysilicon upper electrode and tungsten lower electrode.

Figure 6:
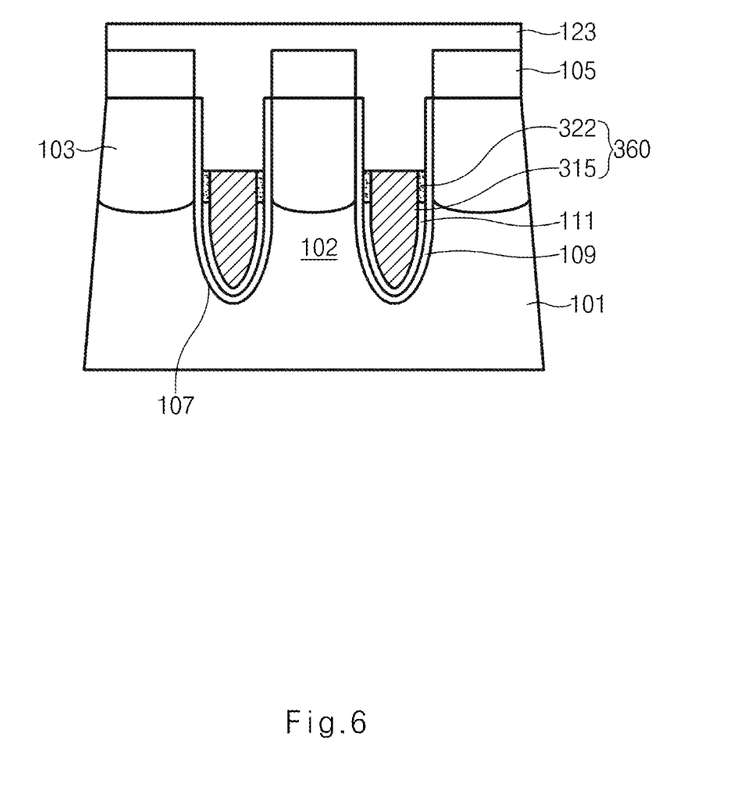
FIG. 6 is a cross-sectional view illustrating a semiconductor device taken along the line A-A' of FIG. 1 according to a third embodiment.

FIG. 6 is a cross-sectional view illustrating a semiconductor device taken along the line A-A' of FIG. 1 according to a third embodiment.

Referring to FIG. 6, the buried gate 360 includes a gate insulation film 109 and a barrier metal film 111 sequentially formed in a trench, a first gate electrode 315 formed over the barrier metal film 111, and a second gate electrode 322 formed between the first gate electrode 315 and the sidewalls of the trench 107. A space is between the first gate electrode 315 and sidewalls of the trench 107. A barrier metal film 111 is filled a lower portion of the space and the second gate electrode 322 disposed in upper portion of the space between the first gate electrode 315 and sidewalls of the trench 107. As described above, in embodiments, polysilicon formed by impurity implantation is silicided so that a polycide material is used as a second gate electrode.

In more detail, whereas a silicide material has the same workfunction as that of tungsten when polysilicon in which impurities are not implanted is silicided, a polycide material formed by silicidation of the impurity-implanted polysilicon may have the same workfunction as that of polysilicon. A polycide material formed by silicidation of impurity-implanted polysilicon has advantages over silicide or polysilicon when used as the second gate electrode.

In an embodiment, a double gate structure in which a metal material such as tungsten (first gate electrode) and a polycide material (second gate electrode) are stacked is implemented, such that the semiconductor device according to embodiments can obtain the same GIDL prevention effect as that of a double gate structure formed by a stacked structure of metal and polysilicon while overcoming disadvantages with respect to interfacial resistance between tungsten and polysilicon.

FIGS. 4A to 4G are cross-sectional views illustrating a method for forming a semiconductor device according to a first embodiment.

Figure 4A:
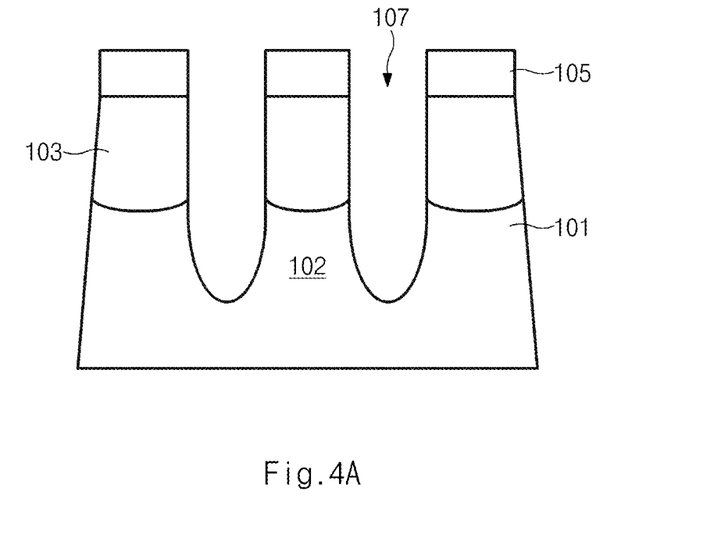
FIGS. 4A to 4G are cross-sectional views illustrating a method for forming a semiconductor device according to a first embodiment.

Referring to FIG. 4A, a hard mask film 105 for forming a trench 107 is formed over a semiconductor substrate 101 with an active region 102 defined by a device isolation film (not shown). In an embodiment, junction region 103 is formed in the active region 102. The trench 107 is formed in the semiconductor substrate 101 using the hard mask film 105 as a mask. In an embodiment, the trench 107 may be formed to have a depth of 1500 Å.

Figure 4B:
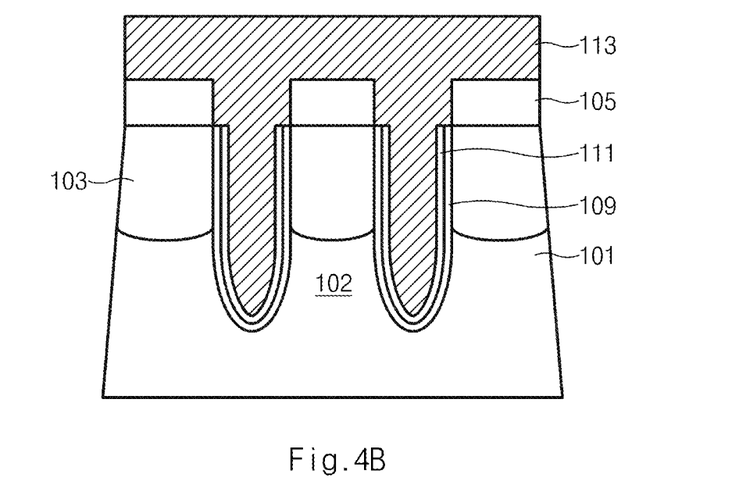

Referring to FIG. 4B, a gate insulation film 109 and a barrier metal film 111 are sequentially deposited in the trench 107 and along a step difference of the hard mask film 105 An etching process is performed, and portions of gate insulation film 109 and barrier metal film 111 disposed over an upper surface and sidewalls of hard mask film 105 are removed. Subsequently, a first gate material 113 is deposited over an entire surface of the semiconductor device covering the hard mask layer 105 and filling the trench 107.

In an embodiment, the gate insulation film 109 is formed to protect silicon surfaces of semiconductor substrate 101 exposed by trenches 107, and may be deposited by performing a Chemical Vapor Deposition (CVD) process on High-K materials (such as SiO, ONO, $HfO_2x$, ZrO, etc.) or lead zirconate titanate (PZT) materials, or by heating the semiconductor substrate in a furnace. In an embodiment, the gate insulation film 109 may be obtained by depositing High-K materials such as Zr or Hf on the surface of the trench 107 by an Atomic Layer Deposition (ALD) process to be subject to oxidation.

In addition, barrier metal film 111 is formed between the gate insulation film 109 and the first gate material 113. Barrier metal film 111 increases a bonding strength of the gate insulation film 109 and the first gate material 113. In an embodiment, barrier metal film 111 may be formed of a single material such as Ti or TiN, or a combination of a plurality of materials.

In an embodiment, the first gate material 113 may be formed of a single material, such as tungsten (W), titanium (Ti), aluminum (Al), tantalum (Ta), tungsten nitride (WNx), aluminum nitride (AlNx), titanium nitride (TiNx), titanium silicide (TiSix), or cobalt silicide (CoSix), or a combination thereof.

Figure 4C:
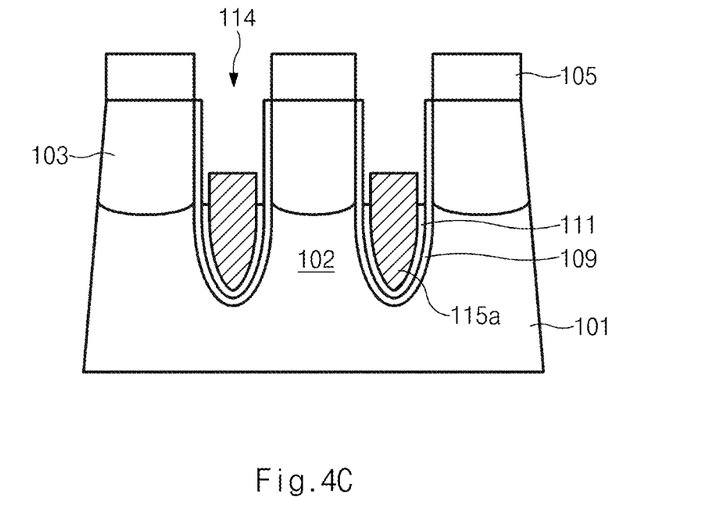

Referring to FIG. 4C, the first gate material 113 is planarized and etched back, so that some parts of the barrier metal film 111 and the first gate material 113 are removed.

As a result, a gate insulation film 109, a barrier metal film 111, and a first gate electrode 115a are formed at the bottom of the semiconductor device, and a gate insulation film 109 remains over sidewalls of the trench 114. In an embodiment, the barrier metal film 111 formed at a sidewall of an upper part of the first gate electrode 115a is etched so that a top surface of the barrier metal film 111 is at a lower level than a top surface of the first gate electrode 115a, resulting in a step difference between the first gate electrode 115a and the barrier metal film 111. For example, the first gate electrode 115a may have a height of 700 Å, the trench 114 formed over the first gate electrode 115a may have a height of 800 Å, and the barrier metal film 111 may have a height of 600 Å, resulting in a step difference of 100 Å between the first gate electrode 115a and the barrier metal film 111.

Figure 4D:
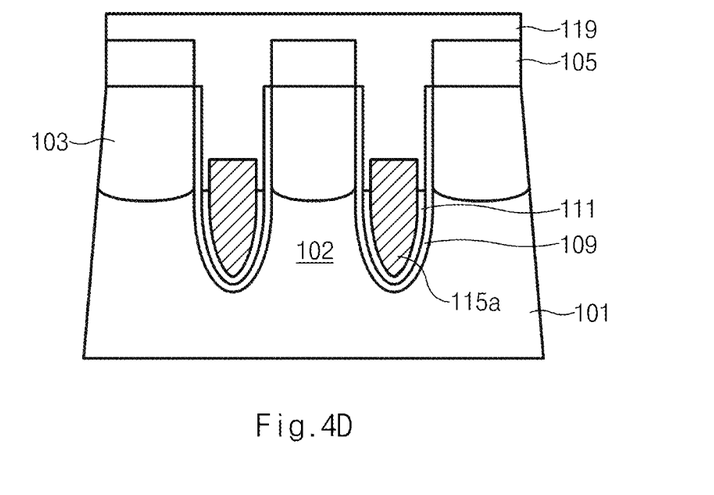

After that, as shown in FIG. 4D, a second gate material 119 is deposited over the entire surface of the first gate electrode 115a and the hard mask film 110. In an embodiment, the second gate material 119 may be an $N^+$ doped polysilicon material.

Figure 4E:
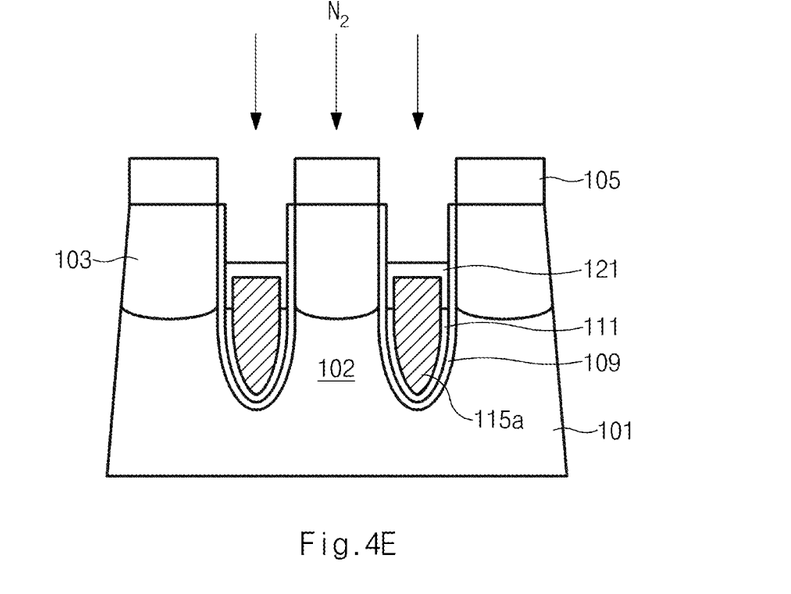

Referring to FIG. 4E, the second gate material 119 is planarized and etched back so that portions of the second gate material 119 remain over top and side surfaces of first gate electrode 115a. As a result, a predetermined thickness of the second gate material 119 may seal the first gate electrode 115a by covering all exposed surfaces of first gate electrode 115a. Thereafter, N-type ions are implanted into the remaining second gate material 119, and the device is heated to a temperature of 750~800° C. in a nitrogen (N2) gas environment, resulting in silicidation of the second gate material 119 to form gate precursor 121. The doping process is performed so that the subsequently formed polycide material has a workfunction that is substantially the same as polysilicon.

Figure 4F:
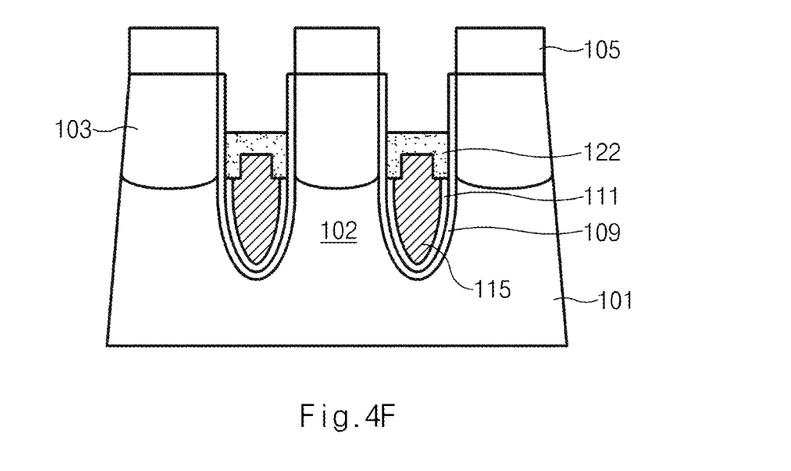

In this case, if the second gate material 119 is an $N^+$ doped polysilicon material, the step of N-type ions are implanted may be omitted. Referring to FIG. 4f, the processes of FIG. 4E result in a second gate electrode 122 formed of polycide and a part the first gate 115 adjacent to the second gate electrode 122 is reacted. So, a upper surface of the first gate electrode 115 has a symmetrical step-difference structure.

Figure 4G:
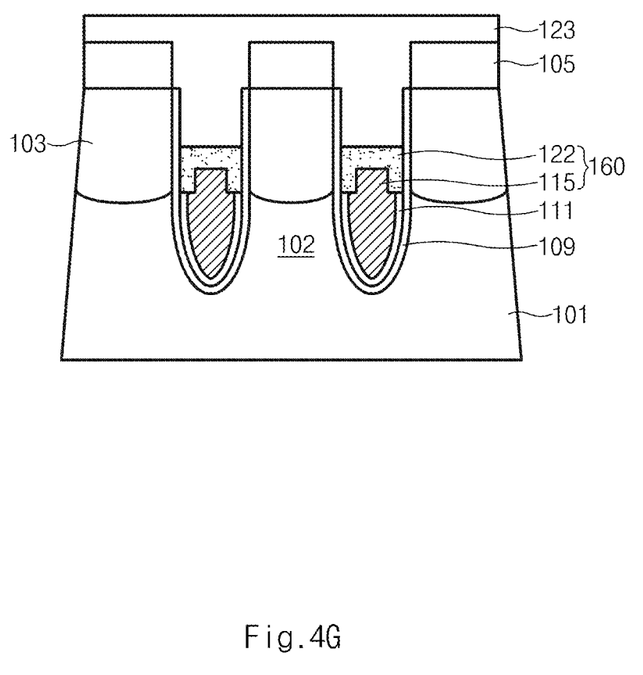

The polycide may include a metal silicide at the interface between the second gate electrode 122 and upper surfaces of doped polysilicon. Referring to FIG. 4G, a sealing film 123 is deposited over the second gate electrode 122 and the hard mask film 105. In an embodiment, the sealing film 123 may be formed of a nitride film.

Thereafter, after removal of the hard mask film 105, a storage node contact (not shown), a bit line contact (not shown), etc. may be formed over the semiconductor substrate including a buried gate 160.

As described above, according to a first embodiment, a first metal-based gate electrode 115 is formed in a trench 107. Portions of sidewalls of the first gate electrode 115 that overlap adjacent junction region 103 are spaced apart from sidewalls of the trench 107 and gate insulation film 109. A second gate electrode 122 is formed over a top surface of the first gate electrode 115 and in the spaces between the first gate electrode 115 and the gate insulation film 109. The second gate electrode 122 is formed by silicidation of $N^+$ doped polysilicon, and overlaps the junction region 103. A resulting semiconductor device has good GIDL characteristics and low contact resistance between the first gate electrode 115 and the second gate electrode 122.

Figure 5A:
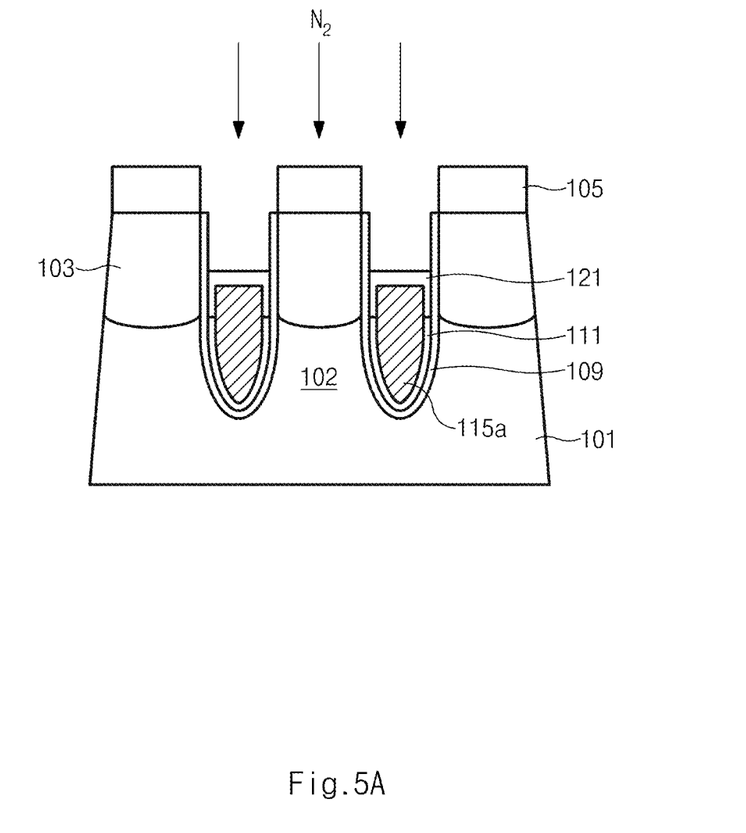
FIGS. 5A to 5C are cross-sectional views illustrating a method for forming a semiconductor device according to a second embodiment.
Figure 5B:
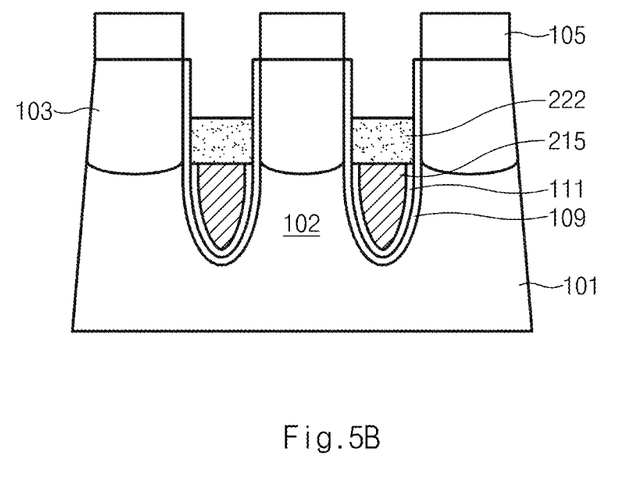
Figure 5C:
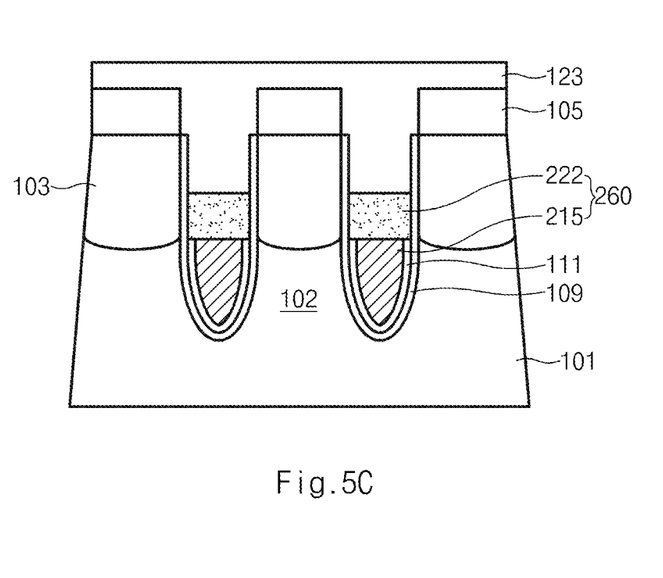

FIGS. 5A to 5C are cross-sectional views illustrating a method for forming a semiconductor device according to a second embodiment.

In order to form a semiconductor device according to a second embodiment, after a trench 107 is formed in a semiconductor substrate 101 as shown in FIGS. 4A to 4D, a first gate electrode 115a is formed in the trench 107, and a second gate material 119 is deposited over the first gate electrode 115a. Thereafter, the second gate material 119 is planarized and etched back, so that etched portion of second gate material 119 remains over the first gate electrode 115a, resulting in second gate precursor 121.

Referring to FIG. 5A, a predetermined thickness of the second gate material 119 covers and seals the first gate electrode 115a. Thereafter, N-type ions are implanted into the first gate electrode 115a and the device is heated at a temperature of 750~800° C. in a nitrogen ($N_2$) gas environment, resulting in silicidation of the second gate material 119 to form second gate precursor 121. Referring to FIG. 5B, a polycide second gate electrode 222 formed by the silicidation process. That is, variables such as temperature and time of the silicidation process are set so that all portions of first gate electrode 115a that overlap with junction regions 103 are silicided. As seen in FIG. 5B, in a resulting structure, a top surface of the first gate electrode 115a is parallel with the bottom of the junction 103. Because the silicidation process substantially changes the shape of first gate electrode 115a, the lower gate electrode of the second embodiment as shown in FIG. 5B will be referred to as first gate electrode 215.

A silicidation process that is used to form first gate electrode 215 in the second embodiment may be performed for a longer time and/or a higher temperature than the silicidation process performed in the first embodiment. Higher temperatures and longer times result in a greater extent of silicidation. Accordingly, the silicidation process of the second embodiment may be performed for a longer time and/or at a higher temperature than the silicidation process of the first embodiment. For example, when a silicidation process of the first embodiment is performed at a temperature of about 750° C., a silicidation process performed on a similar precursor structure to form a semiconductor according to the second embodiment may be performed at a temperature of about 1000° C. In another embodiment, a width of the first gate electrode 215 and a width of the barrier metal film 111 may be established to achieve sufficient silicidation at lower temperatures and shorter times.

Thereafter, referring to FIG. 5C, a sealing film 123 is deposited over the second gate electrode 222 and the hard mask film 105. In an embodiment, the sealing film 123 may be formed of a nitride film. Subsequently, after removal of the hard mask film 105, a storage node contact (not shown), a bit line contact (not shown), etc. may be formed over the semiconductor substrate including the buried gate 160.

As described above, in an embodiment, a metal gate electrode (first gate electrode) having a high workfunction is used in a channel region, and a gate electrode (second gate electrode) having a lower workfunction is used in a portion of a semiconductor device that overlaps with a junction region, such that an overlap region between the junction region and the gate electrode may have a relatively deep depth with improved GIDL characteristics and may prevent deterioration of current drive capability by minimizing gate resistance.

In an embodiment, a polycide material that has substantially the same workfunction as that of polysilicon and better contact performance with a metal gate than polysilicon is used as a second gate electrode. In such an embodiment, problems associated with contact resistance between a metal gate electrode and a polysilicon gate electrode can be minimized. In more detail, if a polycide layer is deposited over a tungsten (W) layer of a double gate structure, the polycide layer can prevent a highly resistive amorphous layer from being formed between the tungsten (W) layer and the polysilicon layer.

When forming a structure in which a polysilicon layer is deposited over the tungsten (W) layer of a double gate structure, a metal contact may be formed in a subsequent metal contact formation process in such a manner that the polysilicon layer is first removed and coupled to the tungsten (W) layer, for which a mask process for removing the polysilicon layer is used. However, a semiconductor device according to an embodiment may use a polycide layer instead of the polysilicon layer without a mask process for removing the polysilicon layer being applied to a process for forming a metal contact coupled to a gate electrode, and a metal contact can be coupled to the polysilicon layer. In other words, embodiments may simplify subsequent processes.

Although embodiments have been described with respect to a $6F^2$ structure in which an active region obliquely crosses a word line (gate), embodiments are not limited thereto and can be applied to other structures. That is, aspects of the present disclosure may be applied to structures that include which a gate is buried in the active region.

As is apparent from the above description, a semiconductor device and the method for forming the same according to embodiments can maintain an overlap region between a junction region and a buried gate so as to improve GIDL characteristics, and can prevent deterioration of device characteristics and reliability by reducing contact resistance between double gate electrodes.

Those skilled in the art will appreciate that aspects of the present invention may be carried out in specific ways other than those set forth herein without departing from the spirit and characteristics of various embodiments. The above exemplary embodiments are therefore to be construed in all aspects as illustrative and not restrictive. The scope of the claims should be determined by the language of the claims themselves and their legal equivalents, not limited by the above descriptions, and all changes coming within the meaning and equivalency range of the appended claims are intended to be embraced therein.

The above embodiments are illustrative and not limiting. Various alternatives and equivalents are possible. Embodiments are not limited by the type of deposition, etching polishing, and patterning steps described herein. Nor are embodiments limited to any specific type of semiconductor device. For example, embodiments may be implemented in a dynamic random access memory (DRAM) device or a nonvolatile memory device. Other additions, subtractions, or modifications are possible in view of the present disclosure and are intended to fall within the scope of the appended claims.

What is claimed is:

1. A semiconductor device comprising:
   a trench in a semiconductor substrate;
   a junction region disposed on two sides of the trench;
   a first gate electrode buried in the trench in such a manner that the first gate electrode has a step difference at a top surface thereof and has a first workfunction; and
   a second gate electrode disposed over the first gate electrode, the second gate electrode including a polycide material and having a second workfunction,
   wherein the second gate electrode overlaps with the junction region, and wherein the second gate electrode surrounds an upper portion of the first gate electrode.

2. The semiconductor device according to claim 1, wherein the second workfunction is substantially the same as a workfunction of un-doped polysilicon.

3. The semiconductor device according to claim 1, wherein the second gate electrode includes a silicide of doped polysilicon.

4. The semiconductor device according to claim 3, wherein the doped polysilicon is doped with $N^+$ ions.

5. The semiconductor device according to claim 1, wherein the first electrode is formed to have a symmetrical step structure such that both sides contiguous to the junction region are lower in height than a center part between the both sides.

6. The semiconductor device according to claim 1, wherein the first gate electrode includes a metal material.

7. The semiconductor device according to claim 1, further comprising:
   a gate insulation film disposed over sidewalls of the trench; and
   a barrier metal film disposed over the gate insulation film.

8. The semiconductor device according to claim 1, wherein the first workfunction is higher than the second workfunction.

\* \* \* \* \*